US006459326B2

(12) United States Patent
Descombes

(10) Patent No.: US 6,459,326 B2

(45) Date of Patent: Oct. 1, 2002

(54) METHOD FOR GENERATING A SUBSTANTIALLY TEMPERATURE INDEPENDENT CURRENT AND DEVICE ALLOWING IMPLEMENTATION OF THE SAME

(75) Inventor: Arthur Descombes, Kerzers (CH)

(73) Assignee: EM Microelectronic-Marin SA (SE)

( * ) Notice: Subject to any disclaimer, the term of this patent is extended or adjusted under 35 U.S.C. 154(b) by 0 days.

(21) Appl. No.: 09/874,988

(22) Filed: Jun. 7, 2001

(30) Foreign Application Priority Data

Jun. 13, 2000 (CH) ............................................ 1158/00

(51) Int. Cl.[7] ............................................ H01L 35/00

(52) U.S. Cl. ...................................... 327/513; 327/362

(58) Field of Search ................................ 327/512, 513, 327/560–563, 362, 378

(56) References Cited

U.S. PATENT DOCUMENTS 4,168,492 A * 9/1979 Uya ........................... 327/346
5,229,710 A * 7/1993 Kraus et al. ................ 323/313
5,266,885 A * 11/1993 Brambilla et al. .......... 323/313
5,774,013 A * 6/1998 Groe .......................... 323/312
5,805,004 A 9/1998 Tanten et al.
5,933,051 A 8/1999 Tsuchida et al.
5,949,225 A * 9/1999 Sawtell ....................... 323/284
5,982,226 A 11/1999 Rincon-Mora
6,052,035 A * 4/2000 Nolan et al. ................ 331/111
6,191,660 B1 * 2/2001 Mar et al. ................... 331/111

FOREIGN PATENT DOCUMENTS

JP 10-284949 A 10/1998

* cited by examiner

*Primary Examiner*—Kenneth B. Wells
*Assistant Examiner*—Cassandra Cox
(74) *Attorney, Agent, or Firm*—Griffin & Szipl, P.C.

(57) ABSTRACT

A method and a device for generating a substantially temperature independent current (I1) are described. To generate this current (I1), a conventional current generator circuit including an operational amplifier (11) controlling a transistor (12) having one (12*a*) of its current electrodes (12*a*, 12*b*) connected to a resistor (13) and to an input terminal (11*b*) of the operational amplifier (11), is used. According to the invention, a temperature stable input voltage (Vin) is applied at the other input terminal (11*a*) of the operational amplifier (11), and the latter is arranged so that it has an offset voltage (Vos(T)) between its input terminals (11*a*, 11*b*) having a temperature dependence, this offset voltage (Vos(T)) and the input voltage (Vin) being adjusted to compensate for the temperature dependence of the resistor (13) such that the current generated (I1) is substantially temperature independent. According to the invention, the geometry of the differential pair of the operational amplifier (11) is acted upon to generate the offset voltage (Vos(T)).

9 Claims, 4 Drawing Sheets

METHOD FOR GENERATING A SUBSTANTIALLY TEMPERATURE INDEPENDENT CURRENT AND DEVICE ALLOWING IMPLEMENTATION OF THE SAME

The present invention concerns generally the field of current generator circuits. More particularly, the present invention relates to a method for generating a substantially temperature independent current and a device allowing implementation of the same.

Figure 1:
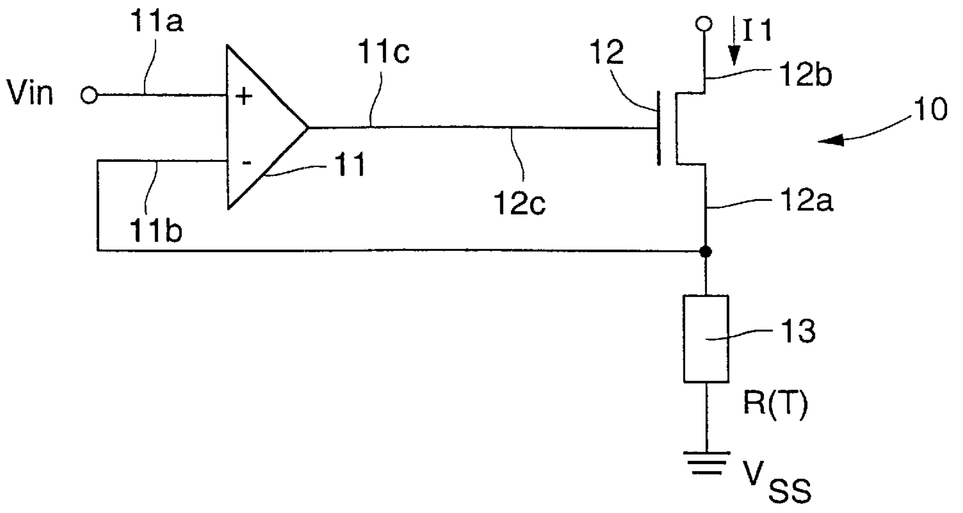
Fig. 1 ( PRIOR ART )

Current generator circuits, commonly known by the name of "current sources" or "current sinks" are important elements in the design of numerous electric and electronic circuits. FIG. 1 shows an example of a current generator circuit of the prior art globally designated by the reference numeral 10. This current generator circuit 10 constitutes a voltage controlled current generator circuit.

Current generator circuit 10 typically includes amplifying means formed of an operational amplifier or differential amplifier 11, a transistor 12 and a resistor 13. Operational amplifier 11 includes a positive input terminal (non inverting input) 11*a* at which is applied an input voltage designated Vin, a negative input terminal (inverting input) 11*b* and an output 11*c*. Amplifying means 11 supplies a voltage at its output 11*c* in response to a difference between the voltages applied respectively to its first and second input terminals 11*a* and 11*b*.

Transistor 12 is formed in this example of an n-MOS field effect transistor whose gate 12*c* is connected to the output 11*c* of operational amplifier 11. Source 12*a* of transistor 12 is connected to negative input 11*b* of operational amplifier 11 and to a first terminal of resistor 13. The other terminal of resistor 13 is connected to a supply potential or reference potential Vss. This reference potential Vss is typically defined as the most negative potential of the circuit or the circuit's earth at 0 volts. Another supply potential Vdd (not illustrated in FIG. 1) is also provided. Potentials Vss and Vdd constitute supply voltages for the circuit, and particularly for operational amplifier 11.

According to the current generator circuit of FIG. 1, a current designated 11 passes through the drain-source branch 12*a*–12*b* of MOS transistor 12. The analysis of this circuit is direct. Operational amplifier 11 modifies the voltage at its output 11*c* such that the voltage present at its negative input 11*b* is substantially equal to the voltage present at its positive input 11*a*, i.e. substantially equal to input voltage Vin. The voltage across the terminals of resistor 13 is thus substantially equal to input voltage Vin, such that current 11 passing through the drain-source branch of MOS transistor 12 is given by:

$$I1 = \frac{Vin}{R} \tag{1}$$

where R is the value of resistor 13. Generated current I1 is thus proportional to input voltage Vin applied at positive input 11*a* of the operational amplifier.

Figure 2:
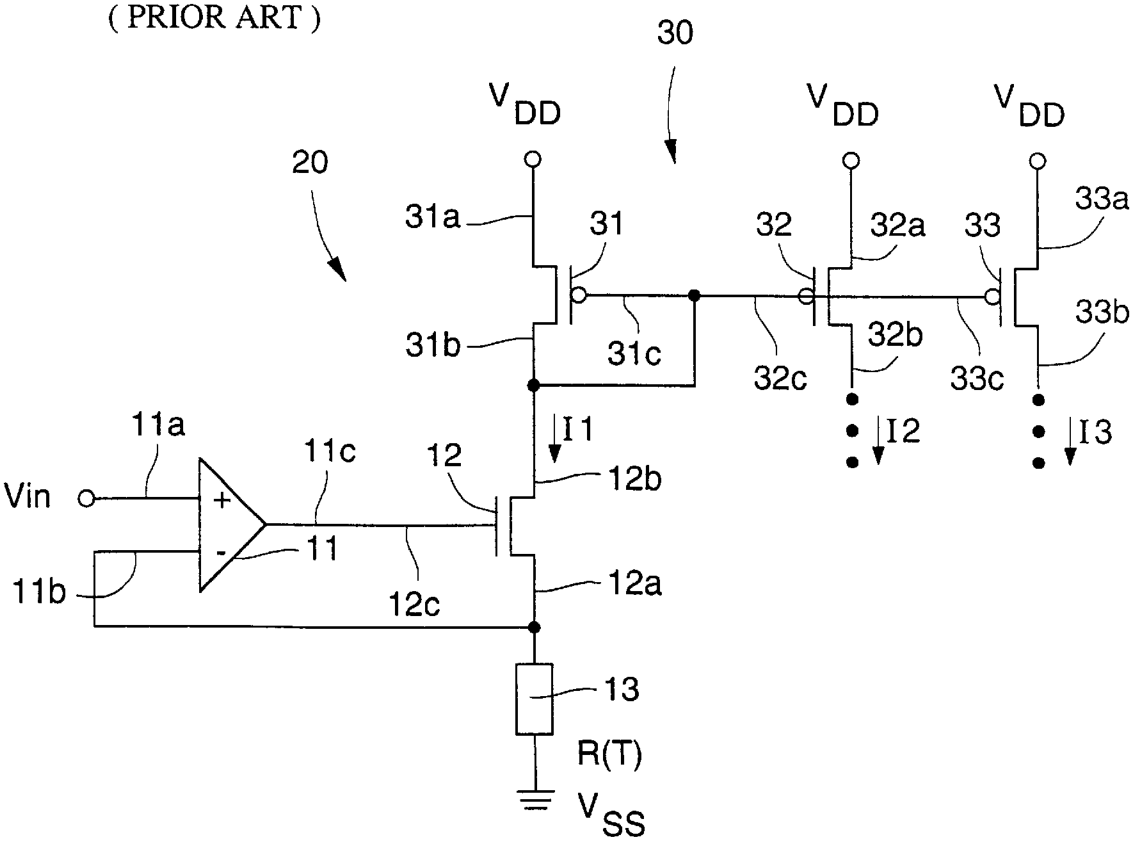
Fig. 2 ( PRIOR ART )

Current generator circuit 10 of FIG. 1 forms a "current sink", i.e. a current I1 is drained from drain 12*b* of transistor 12 towards the most negative potential Vss. A modification of circuit 10 of FIG. 1 allows a current source to be formed. FIG. 2 illustrates a generator circuit designated 20 showing such a modification. Identical reference numerals are used to indicate those elements which have already been presented, i.e. operational amplifier 11, MOS transistor 12 and resistor 13.

In addition to the elements already mentioned, generator circuit 20 of FIG. 2 typically includes a current mirror 30 formed of first and second p-MOS field effect transistors respectively designated 31 and 32. Sources 31*a* and 32*a* of transistors 31 and 32 are connected to the most positive supply potential Vdd. Gate 31*c* and drain 31*b* of transistor 31 are connected together to drain 12*b* of transistor 12 and gate 32*c* of transistor 32 is connected to gate 31*c* of transistor 31.

Current mirror 30 thus operates so as to "copy" current 11 and generate a current which is the image of current I1 in the drain-source branch of transistor 32. In accordance with what is typically known in the field, a proportionality factor can be introduced into the mirror by a suitable choice of the channel width to length ratios W/L of MOS transistors 31, 32 in order to multiply or divide current I1.

Circuit 20 of FIG. 2 may of course be further modified so that the current mirror includes other branches, for example a third MOS field effect transistor 33 as indicated in FIG. 2 in order to generate a third current 13.

One problem of the current generator circuits illustrated in FIGS. 1 and 2 lies in particular in the temperature dependence of the currents generated. Typically, a temperature stable voltage such as a reference bandgap voltage approximately equal to 1.2 volts is used as input voltage Vin. This reference bandgap voltage has a relative low temperature dependence of the order of 50 ppm/°C.

In order to make resistor 13, it is also sought to use a resistor whose temperature coefficient is relatively low. For design reasons, it is also sought to make resistor 13 in an integrated form and to avoid using a resistor external to the circuit. Various solutions exist in CMOS technology to design integrated resistors. It can however be noted that the temperature coefficients of these integrated resistors remains relatively high with respect to the temperature stability of a reference bandgap voltage. By way of example, an integrated resistor of the Rpoly type, i.e. an integrated resistor formed of a polysilicon layer, typically has a temperature coefficient of the order of +0.07%/°C., namely a temperature coefficient which remains substantially significant with respect to the stability of a reference bandgap voltage.

Those skilled in the art quickly note that there is no satisfactory way available, in CMOS technology, of making integrated resistors with sufficiently low temperature coefficients. With the aim of making a current generator circuit of the aforementioned type, the current generated by means of such a circuit will thus have a temperature dependence essentially due to the temperature dependence of the integrated resistor used.

A general object of the present invention is thus to propose a method for generating a substantially temperature independent current by means of a current generator circuit of the aforementioned type.

Another object of the present invention is to propose a device allowing the aforementioned method to be implemented, namely a current generator circuit overcoming the drawbacks encountered with the use of integrated resistors and arranged to generate a substantially temperature independent current.

A further object of the present invention is to propose a solution which involves only a few modifications to the current generator circuit and which consequently proves simple and inexpensive to manufacture with respect to the already existing solutions.

In order to answer these objects, the present invention first concerns a method for generating a substantially temperature independent current the features of which are listed in claim 1.

The present invention also concerns a current generator circuit the features of which are listed in claim 5.

The present invention relies on the observation by the inventor of the possibility of compensating for the temperature dependence of the current due to the resistor used by acting on the geometry of the differential pair of transistors of the operational amplifier used, in order to intentionally generate an offset voltage between the input terminals of the operational amplifier, this offset voltage being adjusted to have a temperature dependence compensating for the temperature dependence of the resistor used.

Indeed, the inventor was able to observe that by arranging the operational amplifier so as to create a geometric imbalance between the two transistors of the differential pair of said amplifier, an offset voltage between the input terminals of the amplifier was generated, this offset voltage having a substantially linear temperature dependence able to be adjusted by working with the geometry of the transistors of the differential pair, in particular by the bias of their dimensional channel width over length ratio W/L.

One advantage of the present invention lies in the simplicity of its implementation and in the low modification cost. Moreover, the offset voltage of the operational amplifier can be adjusted to have independently a positive or negative temperature coefficient according to whether one acts on one or the other of the transistors of the differential pair. It is thus possible to compensate for the temperature dependence of resistors having either a positive or a negative temperature coefficient.

Figure 3:
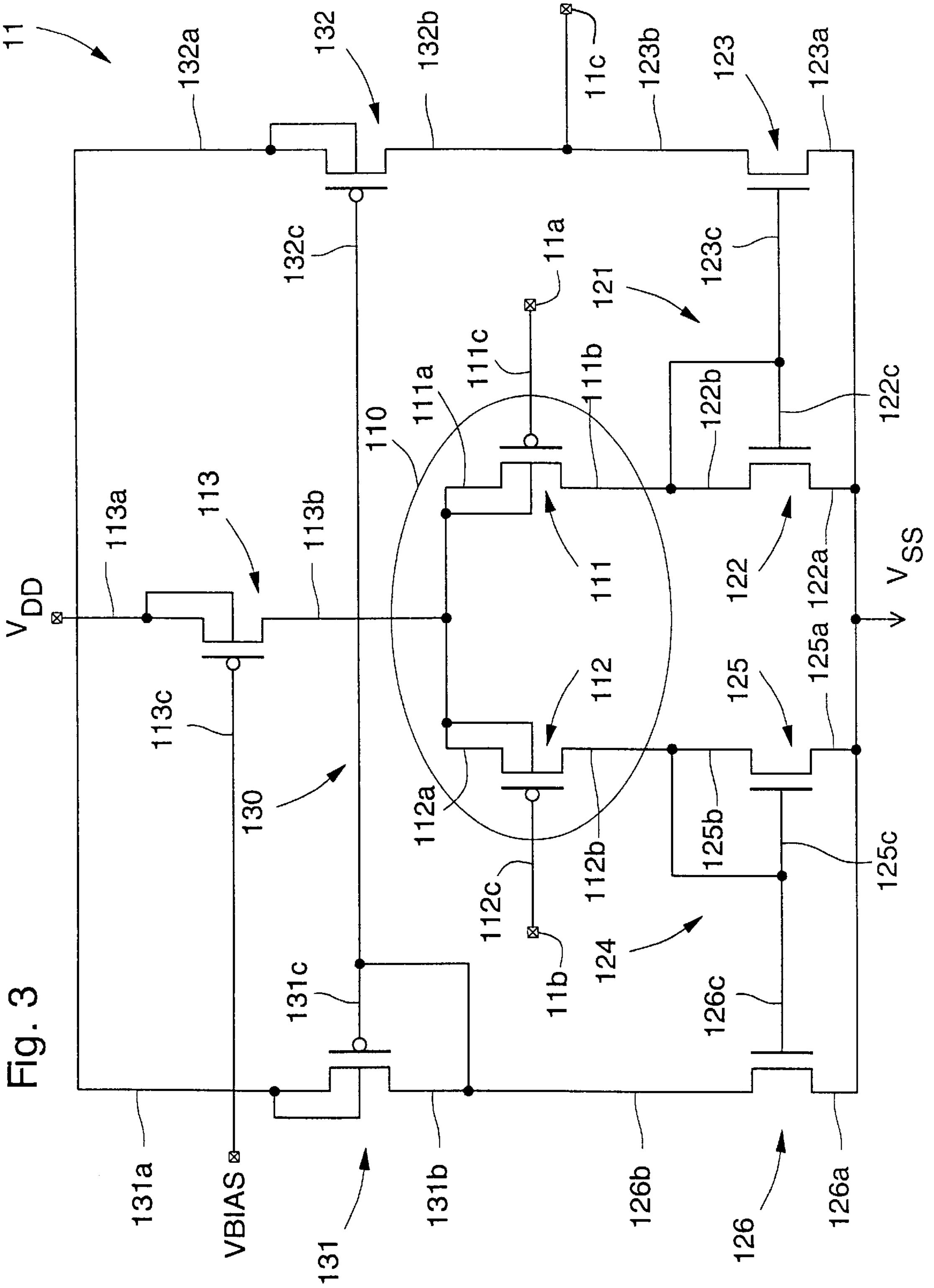
Figure 4:
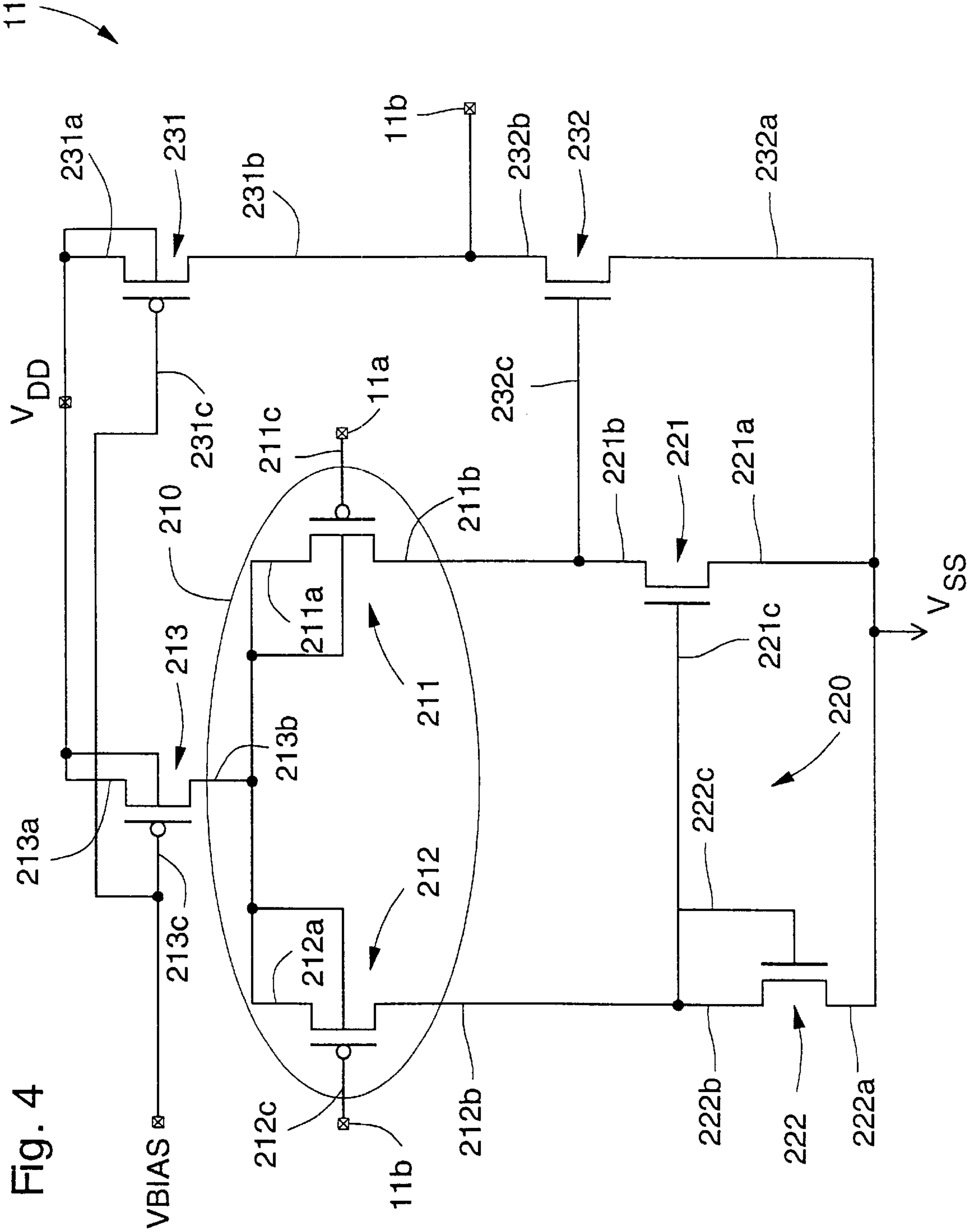
Figure 5:
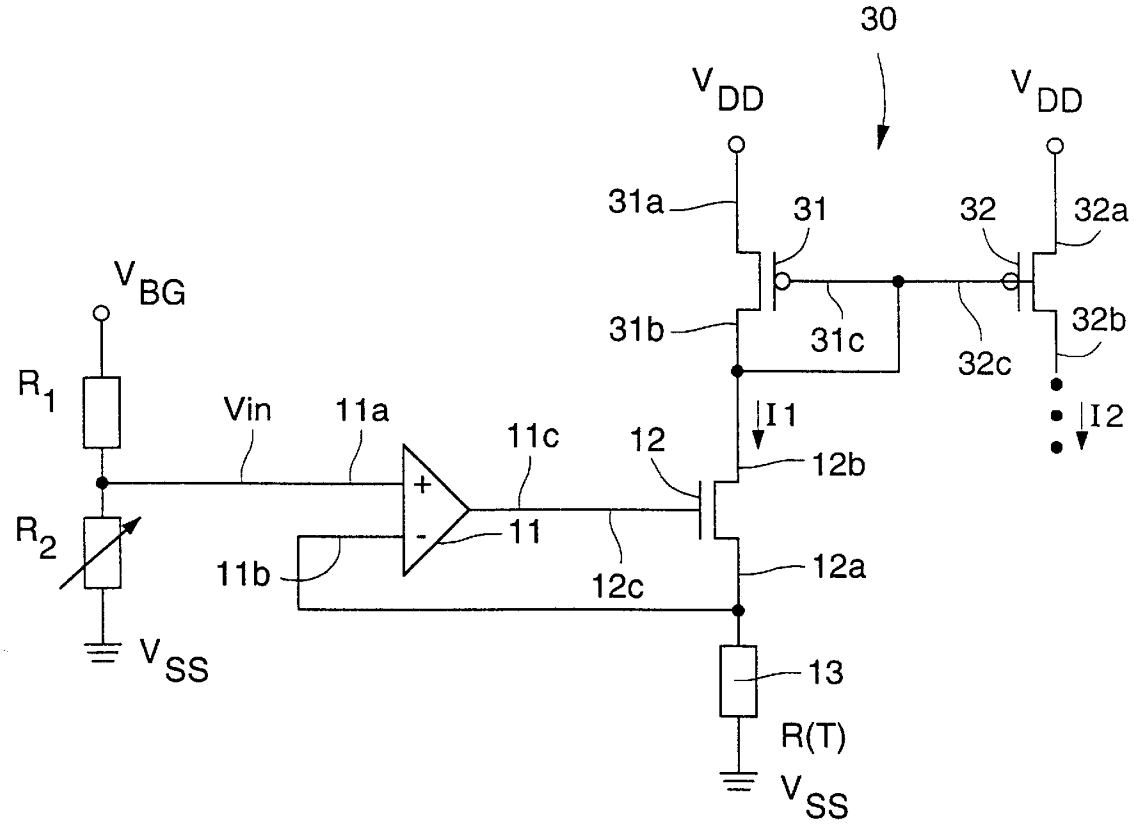

Other features and advantages of the present invention will appear more clearly upon reading the following detailed description, made with reference to the annexed drawings, given by way of non limiting examples in which:

FIG. 1, which has already been presented, shows a schematic example of a current generator circuit of the prior art forming a current sink;

FIG. 2, which has already been presented, shows a schematic example of a current generator circuit of the prior art forming a current source;

FIG. 3 shows a first schematic example of an operational amplifier or differential amplifier able to be used within the scope of the present invention;

FIG. 4 shows another schematic example of an operational amplifier or differential amplifier also able to be used within the framework of the present invention; and FIG. 5 shows an implementation example of the present invention including a resistive divider at the positive input of the operational amplifier in order to derive a suitable input voltage from a temperature stable reference voltage, such as a bandgap voltage.

Within the framework of the present invention, reference is made to a current generator circuit in accordance with the illustrations of FIGS. 1 and 2. These constituent elements of this current generator circuit which have already been presented in the preamble will not be described again in detail and reference will simply be made to the references of FIGS. 1 and 2 which have already been discussed.

What is meant by "differential pair" within the framework of the present invention will now be defined. Operational amplifiers or differential amplifiers typically have a pair of transistors mounted in a differential arrangement and wherein the control electrodes are respectively connected to the input terminals of the amplifier.

By way of illustration, FIG. 3 shows a schematic example of a differential amplifier able to be used as amplifying means 11 of the current generator circuit according to the invention.

The operational amplifier illustrated in FIG. 3, globally designated by the reference numeral 11 according to the illustrations of FIGS. 1 and 2, thus includes a differential pair of transistors, designated 110, including two p-MOS transistors 111 and 112 the sources 111*a* and 112*a* of which are connected to each other. The gates 111*c* and 112*c* of the transistors of differential pair 110 form respectively the input terminals 11*a* and 11*b* of operational amplifier 11.

The sources 111*a* and 112*a* of the transistors of differential pair 110 are connected to drain 113*b* of a p-MOS transistor 113 whose source 113*a* is connected to supply potential Vdd. The gate 113*c* of this transistor 113 is controlled by a polarisation voltage VBIAS.

Operational amplifier 11 of FIG. 3, further includes two current mirrors 121 and 124 each including two n-MOS transistors 122 and 123, respectively 125 and 126. Sources 122*a*, 123*a*, 125*a* and 126*a* of these transistors are connected to the supply potential or earth Vss. The gates 122*c* and 123*c* of transistors 122, 123 and drain 122*b* of transistor 122 are together connected to drain 111*b* of first transistor 111 of differential pair 110. Likewise, gates 125*c* and 126*c* of transistors 125, 126 and drain 125*b* of transistor 125 are together connected to drain 112*b* of second transistor 112 of differential pair 110.

Finally, operational amplifier 11 of FIG. 3 also includes another current mirror 130 including two p-MOS transistors 131 and 132. Sources 131*a* and 132*a* of these transistors are connected to supply potential Vdd whereas drains 131*b* and 132*b* are respectively connected to drains 126*b* and 123*b* of transistors 126 and 123 of current mirrors 124 and 121. Moreover, gates 131*c* and 132*c* of transistors 131 and 132 and drain 131*b* of transistor 131 are connected to each other. Output 11*c* of the operational amplifier is formed of the connection node between drain 132*b* and drain 123*b* of transistor 123.

By way of second illustration, FIG. 4 shows schematically another example of an operational amplifier able to be used as amplifying means 11 of the current generator circuit according to the present invention.

The operational amplifier illustrated in FIG. 4, globally designated by the reference numeral 11 in accordance with the illustrations of FIGS. 1 and 2, thus includes a differential pair of transistors, designated 210, including two p-MOS transistors 211 and 212 the sources 211*a* and 212*a* of which are connected to each other. The gates 211*c* and 212*c* of the transistors of differential pair 210 form respectively the input terminals 11*a* and 11*b* of operational amplifier 11.

The sources 211*a* and 212*a* of the transistors of differential pair 210 are connected to the drain 213*b* of a p-MOS transistor 213 whose source 213*a* is connected to supply potential Vdd. The gate 213*c* of this transistor 213 is controlled by a polarisation voltage VBIAS.

Operational amplifier 11 of FIG. 4, further includes a current mirror 220 including two n-MOS transistors 221 and 222. The sources 221*a*, 222*a* of these transistors are connected to the supply potential or earth Vss. The gate 221*c* and 222*c* of transistors 221, 222 and drain 222*b* of transistor 222 are together connected to drain 212*b* of the second transistor 212 of differential pair 210. Drain 221*b* of transistor 221 is connected to drain 211*b* of the first transistor 211 of differential pair 210.

Operational amplifier 11 of FIG. 4 further includes a branch connected between the supply potentials Vdd and Vss including a p-MOS transistor 231 and an n-MOS transistor 232. Source 231*a* of transistor 231 is connected to supply potential Vdd, whereas gate 231*c* of this transistor is connected to polarisation voltage VBIAS. Source 232*a* of transistor 232 is connected to ground potential Vss whereas gate 232*c* of this transistor is connected to the connection node between drain 211*b* of transistor 211 of the differential pair and drain 221*b* of transistor 221 of current mirror 220. Drains 231*b* and 232*b* of transistors 231 and 232 are connected to each other and form output 11*c* of the operational amplifier.

The operational amplifiers illustrated in FIGS. 3 and 4 are only given here by way of non limiting example in order to illustrate the concept of the present invention. It goes without saying that other embodiments of operational amplifiers allowing the objects of the present invention to be answered may be envisaged by those skilled in the art.

Whether one of the examples of operational amplifiers from FIGS. 3 and 4, or another similar operational amplifier is selected, it is assured, according to the present invention, on the one hand that the operational amplifier works in weak inversion, i.e. the transistors of the differential pair of operational amplifier 11 operate with a lower gate-source voltage than the threshold voltage of these transistors.

In order to assure that the operational amplifiers of FIGS. 3 and 4 operate in weak inversion, one acts for example on the current generated by transistor 113, respectively 213, of the operational amplifier (see FIG. 3 or 4) by the bias of the polarisation voltage VBIAS applied at gate 113*c*, respectively 213*c*, of the transistor. By acting like this to make the operational amplifier operate in weak inversion, one assures, as will be seen hereinbelow, substantially linear behaviour of the offset voltage generated.

According to the present invention, operational amplifier 11 is arranged on the other hand so that it has an offset voltage Vos(T) between its first and second input terminals 11*a*, 11*b* having a temperature dependence. This offset voltage Vos(T) is adjusted according to the present invention to have a temperature dependence allowing the temperature dependence of resistor 13 to be compensated for.

In order to generate this offset voltage Vos(T), one can act directly on the dimensional channel width to length ratio W/L of each transistor of the differential pair. More specifically, offset voltage Vos(T), in weak inversion, can be expressed in the following form:

$$Vos(T) = \frac{kT}{q}\ln X \qquad (2)$$

where $$X = \frac{(W/L)_2}{(W/L)_1} \qquad (3)$$

T being the absolute temperature in degrees Kelvin.

Factors $(W/L)_1$ and $(W/L)_2$ are defined as the channel width to length ratios W/L of the transistors forming the differential pair of operational amplifier 11.

It can easily be seen from expression (2) that voltage Vos(T) has a substantially linear temperature dependence. Moreover, depending upon whether one acts on the dimensional ratios W/L of one or other of the transistors of the differential pair, it will be understood that an offset voltage Vos(T) having a positive or negative temperature coefficient can be generated.

By way of example, by a choice such that the W/L dimensional ratio of each transistor of the differential pair results in ratio X of expression (3) being substantially equal to 16, the offset voltage Vos(T) has a value, at a temperature of the order of 300° K, of approximately 72 mV with a temperature coefficient of approximately +0.24 mV/°K.

Expression (2) above can also be rewritten as follows:

$$Vos(T) = Vos,o + \beta(T - To) \qquad (4)$$

where Vos,o is the value of the offset voltage at a given temperature To, for example 300° K, and β is the temperature coefficient in V/°K. of the offset voltage.

From (2) to (4) it can easily be seen that:

$$\beta = \frac{k}{q}\ln X \qquad (5)$$

and $$Vos,o = \beta To \qquad (6)$$

Taking account of the presence of offset voltage Vos(T), expression (1) of current I1 generated by the current generator circuit then becomes:

$$I1 = \frac{Vin + Vos(T)}{R(T)} \qquad (7)$$

Resistance R as a function of the temperature can be expressed as follows:

$$R(T) = Ro(1 + \alpha(T - To)) \qquad (8)$$

where Ro is the resistance value at given temperature To and α is the temperature coefficient of the resistance in $°K^{-1}$.

From (4), (7) and (8), one thus reaches the conclusion that to generate a substantially temperature independent current II, it is necessary for the following expression to be substantially satisfied:

$$\frac{\beta}{Vin + Vos,o} = \alpha \qquad (9)$$

By way of example, in order to compensate for a resistance temperature coefficient of the order of +0.1% $°K^{-1}$ by means of a differential amplifier whose differential pair has a ratio X, according to expression (3) hereinbefore, with a value of substantially 16, i.e. with Vos,o=72 mV and β=0.24 mV/°K, a voltage Vin with a value of substantially 168 mV allows expression (9) hereinbefore to be satisfied.

In order to generate such an input voltage, it is for example possible to divide a temperature stable reference voltage such as a bandgap voltage $V_{BG}$ of a suitable factor, for example by a resistive divider R1, R2 as illustrated in FIG. 5. Advantageously, one should be able to adjust the division factor of bandgap voltage $V_{BG}$, for example by means of an adjustment of the value of one of resistors R1, R2 of the resistive divider, for example by means of an adjustable resistor R2.

FIG. 5 thus shows a schematic example of an implementation of the present invention forming a current source. This current source is substantially similar to the conventional current source illustrated in FIG. 2. The elements which are already present in FIG. 2, namely operational amplifier 11, MOS transistor 12, resistor 13 and current mirror 30 allowing a second current 12 which is the image of current I1 flowing through the drain-source branch of transistor 12 to be generated, will not be described again.

As already mentioned, the circuit of FIG. 5 includes a resistive divider including two resistors R1 and R2 connected in series between, on the one hand, a temperature stable reference voltage, such as a bandgap voltage $V_{BG}$, and, on the other hand, the supply voltage or ground Vss. The positive input 11$a$ of operational amplifier 11 is connected between resistors R1 and R2 so that the value of input voltage Vin applied at input terminal 11$a$ is determined in a ratio R1/R2 of reference voltage $V_{BG}$. The values of resistors R1 and R2 are determined to generate a suitable input voltage Vin allowing the desired objective, which was discussed fully previously, to be satisfied.

It will of course be noted that the resistive divider formed of resistors R1, R2 in no way affect the temperature stability of reference voltage $V_{BG}$. It will further be noted that those skilled in the art can perfectly well envisage other equivalent solutions allowing the bandgap reference voltage $V_{BG}$ to be divided to produce a suitable value for input voltage Vin, for example by means of a capacitive divider.

It will be understood that various modifications may be made to the method and the device described in the present description without departing from the scope of the invention. In particular, it will be recalled that the examples of operational amplifiers of FIGS. 3 and 4 able to be used and modified according to the present invention to answer the problem posed are in no way limiting and that any other operational amplifier able to operate in weak inversion may be used within the framework of the present invention.

What is claimed is:

1. A method for generating a current including the steps of:

(a) providing a current generator circuit coupled to first and second supply voltages, wherein said current generator circuit comprises:

amplifying means for providing a control voltage at an output of said amplifying means in response to a difference between first and second input voltages applied respectively to first and second input terminals of said amplifying means;

a first transistor having a first current electrode, a control electrode connected to said output of the amplifying means to receive said control voltage, and a second current electrode coupled to said second supply voltage; and means forming a resistor having a first terminal connected to said second input terminal of the amplifying means and to said first current electrode of said transistor, and a second terminal connected to said first supply voltage, this resistor means having a resistance value having a temperature dependence;

(b) providing said control voltage at the output of said amplifying means in response to the difference between the first and second input voltages; and (c) generating with said current generator circuit a first current through said first and second current electrodes of said first transistor which is substantially proportional to said first input voltage, wherein said first input voltage is a substantially temperature stable voltage, wherein said amplifying means is operated in weak inversion, and wherein said amplifying means in arranged such that amplifying means has an offset voltage between said first input voltage being adjusted to compensate substantially for the temperature dependence of said resistor means such that said generated first current is substantially temperature independent, wherein said amplifying means is an operational amplifier including differential pair of transistors whose control electrodes form respectively said first and second input terminals of the amplifying means, and wherein said offset voltage is generated by acting on the channel width to length ratio W/L of the transistors of said differential pair.

2. A method according to claim 1, wherein said offset voltage is given by the following expression:

$$Vos(T) = \frac{kT}{q}\ln X$$

where $$X = \frac{(W/L)_2}{(W/L)_1}$$

$(W/L)_1$ and $(W/L)_2$ being defined as the channel width to length ratios W/L of the transistors forming said differential pair, the factor X and said first input voltage being adjusted to compensate for the temperature dependence of said resistor means so that said first current given by the following expression:

$$I1 = \frac{Vin + Vos(T)}{R(T)}$$

is substantially temperature independent.

3. Current generator circuit coupled to first and second supply voltages including:

amplifying means for providing a control voltage to an output of said amplifying means in response to a difference between first and second input voltages applied respectively to a first and second input terminals of said amplifier means;

a first transistor having a first current electrode, a control electrode connected to said output of the amplifying means to receive said control voltage, and a second current electrode coupled to said second supply voltage; and resistor means having a first terminal connected to said second input terminal of the amplifying means and said first current electrode of said transistor, and a second terminal connected to said first supply voltage, this resistor means having a temperature dependence, third current generator circuit generating a first current through said first and second current electrodes of said first transistor which is substantially proportional to said first input voltage, wherein said first input voltage is a substantially temperature stable voltage, and said amplifying means is arranged to operate in weak inversion and has an offset voltage between said first and second input terminals having a temperature dependence, this offset voltage and said first input voltage being adjusted to compensate for the temperature dependence of said resistor means such that said generated first current is substantially temperature independent, wherein said amplifying means is an operational amplifier including a differential pair of transistors whose control electrodes form respectively said first and second input terminals of the amplifying means, and wherein the geometry of said differential pair of transistors is arranged to generate said offset voltage, said offset voltage being generated by acting on the channel width to length ratio W/L of the transistors of said differential pair.

4. A current generator circuit according to claim 3, wherein said offset voltage is given by the following expression $$Vos(T) = \frac{kT}{q}\ln X$$

where $$X = \frac{(W/L)_2}{(W/L)_1}$$

$(W/L)_1$ and $(W/L)_2$ being defined as the channel width to length ratios W/L of the transistors forming said differential pair, the factor X and said first input voltage being adjusted to compensate for the temperature dependence of said resistor means so that said first current given by the following expression:

$$I1 = \frac{Vin + Vos(T)}{R(T)}$$

is substantially temperature independent.

5. A current generator circuit according to claim 3, wherein said first input voltage is derived from a bandgap reference voltage.

6. A current generator circuit according to claim 5, wherein said transistor is an n-type MOS field effect transistor.

7. A current generator circuit according to claim 3, wherein said circuit further includes a current mirror including second and third transistors each including a control electrode and first and second supply voltage,said control electrodes of the second and third transistors and said second current electrode of the second transistor being connected to said second current electrodes, said first current electrodes of the second and third transistors being connected to said second current electrode of said first transistor, said current mirror generating, through said first and second current electrodes of the third transistor, a second current which is the image of said first current.

8. A current generator circuit according to claim 7, wherein said second and third transistors are p type MOS field effect transistors.

9. A current generator circuit according to claim 3 wherein said resistor means is an integrated resistor.

* * * * *